US012062526B2

(12) United States Patent
Kalsekar

(10) Patent No.: US 12,062,526 B2
(45) Date of Patent: Aug. 13, 2024

(54) SEMICONDUCTOR PROCESSING CHAMBER ARCHITECTURE FOR HIGHER THROUGHPUT AND FASTER TRANSITION TIME

(71) Applicant: Applied Materials, Inc., Santa Clara, CA (US)

(72) Inventor: Viren Kalsekar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 908 days.

(21) Appl. No.: 17/077,934

(22) Filed: Oct. 22, 2020

(65) Prior Publication Data

US 2022/0130649 A1 Apr. 28, 2022

(51) Int. Cl.
*H01L 21/677* (2006.01)
*H01J 37/32* (2006.01)

(52) U.S. Cl.
CPC .. *H01J 37/32743* (2013.01); *H01J 37/32357* (2013.01); *H01J 37/32715* (2013.01); *H01L 21/67703* (2013.01)

(58) Field of Classification Search
CPC .................. H01L 21/67751; H01L 21/67757
See application file for complete search history.

(56) References Cited

U.S. PATENT DOCUMENTS 6,030,459 A * 2/2000 Kawaura ........... H01L 21/67017
156/345.31
6,591,850 B2 * 7/2003 Rocha-Alvarez .... G05D 7/0635
137/9
6,858,085 B1 * 2/2005 Nguyen ................. C23C 16/44
156/345.31

(Continued)

FOREIGN PATENT DOCUMENTS

JP 2004-006794 A 1/2004
KR 2015-0101785 A 9/2015
TW 201714237 A 4/2017

OTHER PUBLICATIONS

KR 10-2015-0101785 A (Wonik IPS Co., Ltd.) Sep. 4, 2015 (English language machine translation). [online] [retrieved Oct. 23, 2023]. Retrieved from: Korean Intellectual Property Office. (Year: 2015).*

(Continued)

*Primary Examiner* — Jonathan Snelting
(74) *Attorney, Agent, or Firm* — Kilpatrick Townsend & Stockton LLP

(57) ABSTRACT

Exemplary substrate processing systems may include a chamber body defining a transfer region. The systems may include a lid plate seated on the chamber body along a first surface of the lid plate. The lid plate may define a plurality of apertures through the lid plate. The lid plate may further define a recess about each aperture of the plurality of apertures in the first surface of the lid plate. Each recess may extend partially through a thickness of the lid plate. The (Continued)

systems may include a plurality of lid stacks equal to a number of apertures of the plurality of apertures. Each recess may receive at least a portion of one of the lid stacks of the plurality of lid stacks. The plurality of lid stacks may at least partially define a plurality of processing regions vertically offset from the transfer region.

16 Claims, 4 Drawing Sheets

(56) References Cited

U.S. PATENT DOCUMENTS

| | | | | |
|---|---|---|---|---|
| 8,444,926 | B2* | 5/2013 | Fodor | ............ C23C 16/46 156/345.37 |
| 2003/0005958 | A1 | 1/2003 | Rocha-Alvarez et al. | |
| 2004/0071874 | A1 | 4/2004 | Shimizu et al. | |
| 2008/0178797 | A1 | 7/2008 | Fodor et al. | |
| 2015/0211114 | A1 | 7/2015 | Kangude et al. | |
| 2020/0203197 | A1 | 6/2020 | Tan et al. | |

OTHER PUBLICATIONS

JP 2004-006794 A (ASM Japan KK) Jan. 8, 2004 (English language machine translation). [online] [retrieved Oct. 23, 2023]. Retrieved from: Espacenet. (Year: 2004).*

International Search Report and Written Opinion mailed Feb. 11, 2022 in International Patent Application No. PCT/US2021/055661, 9 pages.

* cited by examiner

SEMICONDUCTOR PROCESSING CHAMBER ARCHITECTURE FOR HIGHER THROUGHPUT AND FASTER TRANSITION TIME

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate. Additionally, as cluster tools scale, component configurations may no longer adequately support processing or maintenance operations.

Thus, there is a need for improved systems and methods that can be used to efficiently direct substrates within cluster tool environments. These and other needs are addressed by the present technology.

SUMMARY

Exemplary substrate processing systems may include a chamber body defining a transfer region. The systems may include a lid plate seated on the chamber body along a first surface of the lid plate. The lid plate may define a plurality of apertures through the lid plate. The lid plate may further define a recess about each aperture of the plurality of apertures in the first surface of the lid plate. Each recess may extend partially through a thickness of the lid plate. The systems may include a plurality of lid stacks equal to a number of apertures of the plurality of apertures. Each recess may receive at least a portion of one of the lid stacks of the plurality of lid stacks. The plurality of lid stacks may at least partially define a plurality of processing regions vertically offset from the transfer region.

In some embodiments, the systems may also include a plurality of substrate supports disposed about the transfer region. Each substrate support of the plurality of substrate supports may be vertically translatable along a central axis of the substrate support between a first position and a second position. Each substrate support of the plurality of substrate supports may be aligned with a lid stack of the plurality of lid stacks. Each processing region of the plurality of processing regions may be defined from below by an associated substrate support in the second position. Each processing region of the plurality of processing regions may be fluidly coupled with the transfer region and fluidly isolated from above from each other processing region of the plurality of processing regions. The transfer region may include a transfer apparatus rotatable about a central axis and configured to engage substrates and transfer substrates among a plurality of substrate supports within the transfer region. Each lid stack of the plurality of lid stacks may include a pumping liner defining an exhaust plenum positioned atop the chamber body. Each lid stack may include a faceplate seated on the pumping liner and at least partially defining an associated processing region from above. Each lid stack may include a heater seated on the faceplate. Each lid stack may include a diffuser plate seated within a central recess defined by the faceplate. The systems may also include an adaptor plate seated on the chamber body. The systems may include an output manifold seated on the lid plate. The systems may include a remote plasma unit fluidly coupled with an aperture defined by the manifold.

Some embodiments of the present technology may also encompass substrate processing systems. The systems may include a chamber body defining a transfer region. The systems may include a plurality of substrate supports distributed about the transfer region within the chamber body. The systems may include a lid plate seated on the chamber body. The lid plate may define a plurality of apertures through the lid plate equal to a number of substrate supports of the plurality of substrate supports. The lid plate may further define a recess about each aperture of the plurality of apertures in the first surface of the lid plate. Each recess may extend partially through a thickness of the lid plate. Each aperture of the plurality of apertures may be axially aligned with a substrate support of the plurality of substrate supports. Each aperture of the plurality of apertures may be characterized by a diameter greater than a diameter of an associated substrate support of the plurality of substrate supports. The systems may include a plurality of lid stacks equal to a number of apertures of the plurality of apertures. Each lid stack of the plurality of lid stacks may be at least partially received within one of the recesses of the lid plate.

In some embodiments, the plurality of lid stacks may at least partially define a plurality of processing regions vertically offset from the transfer region. Each lid stack may include a faceplate at least partially defining from above an associated processing region of the plurality of processing regions. Each faceplate may define a faceplate recess. Each lid stack may further include a diffuser plate seated within the faceplate recess. Each lid stack may further include a heater seated on the faceplate. Each lid stack may include a pumping liner defining an exhaust plenum. The pumping liner may be positioned atop the chamber body. The systems may include a transfer apparatus positioned within the transfer region and rotatable about a central axis. The transfer apparatus may be configured to engage substrates and transfer substrates among the plurality of substrate supports within the transfer region.

Some embodiments of the present technology may also encompass substrate processing systems. The systems may include a chamber body defining a transfer region. The systems may include an adaptor plate seated on the chamber body. The systems may include a lid plate seated on the adaptor plate along a first surface of the lid plate. The lid plate may define a plurality of apertures through the lid plate. The systems may include a plurality of faceplates. Each faceplate of the plurality of faceplates may be positioned atop the adaptor plate. The plurality of faceplates may at least partially define a plurality of processing regions vertically offset from the transfer region.

Such technology may provide numerous benefits over conventional systems and techniques. For example, the processing systems may provide multi-substrate processing capabilities that may be scaled well beyond conventional designs. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
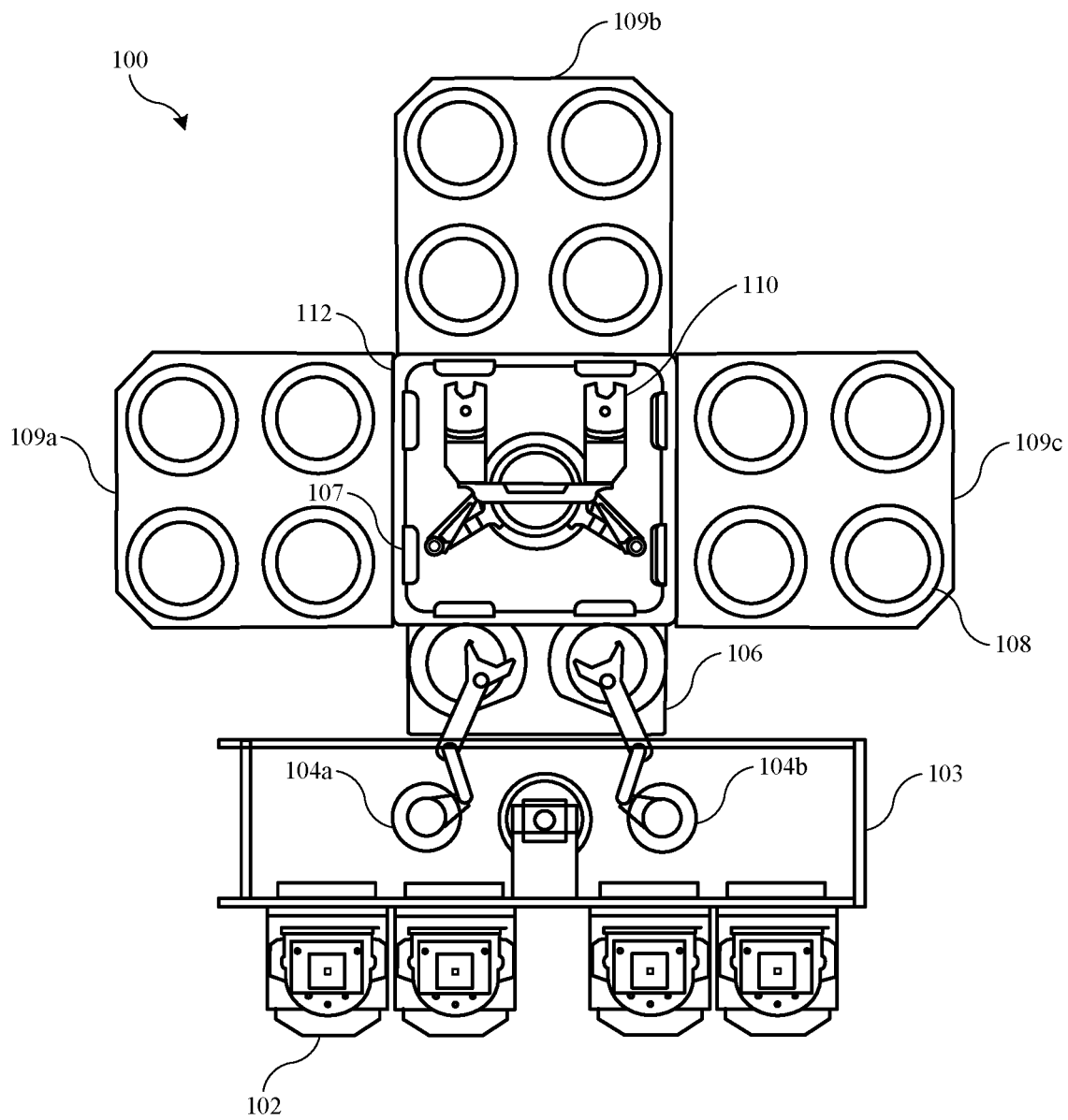
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
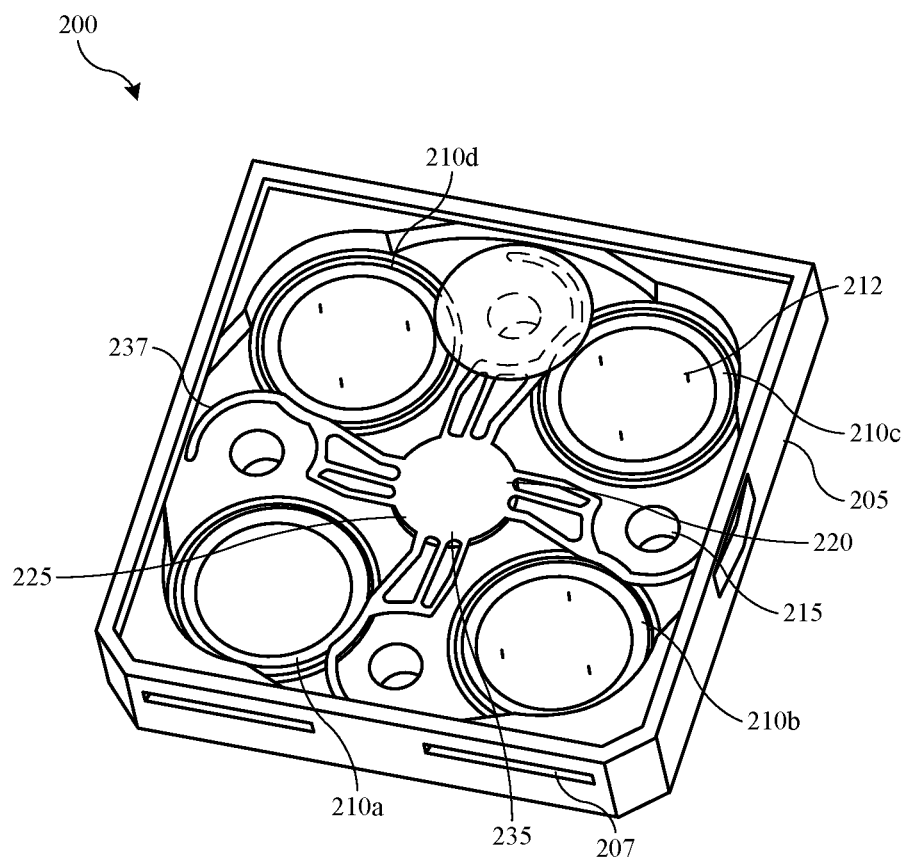
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
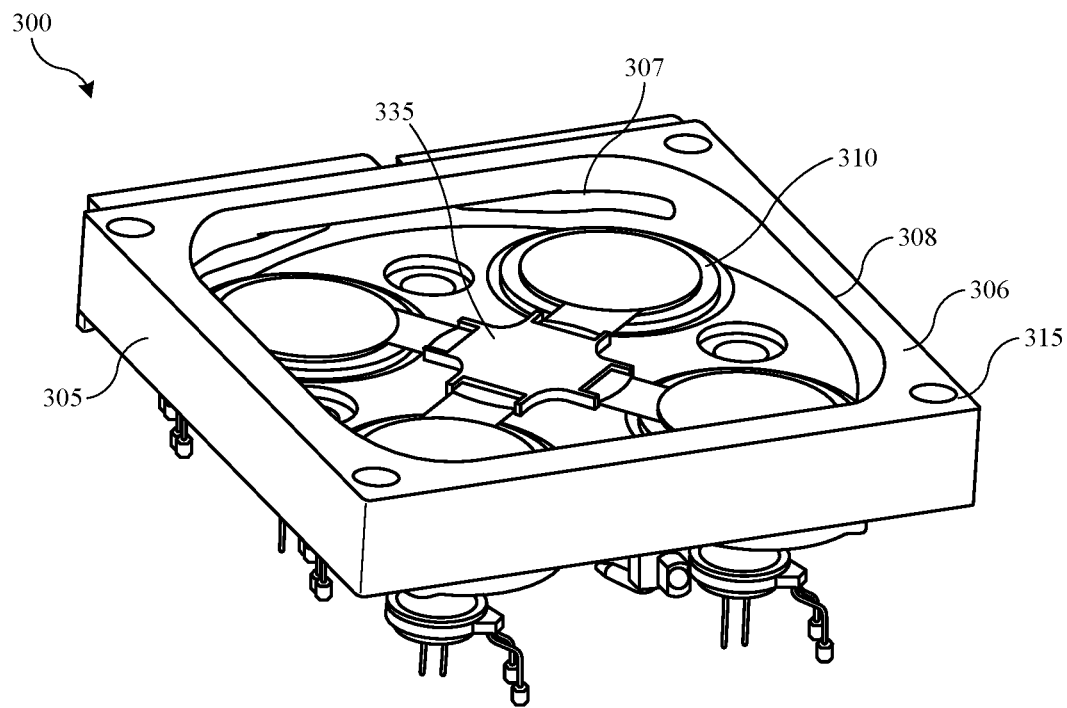
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
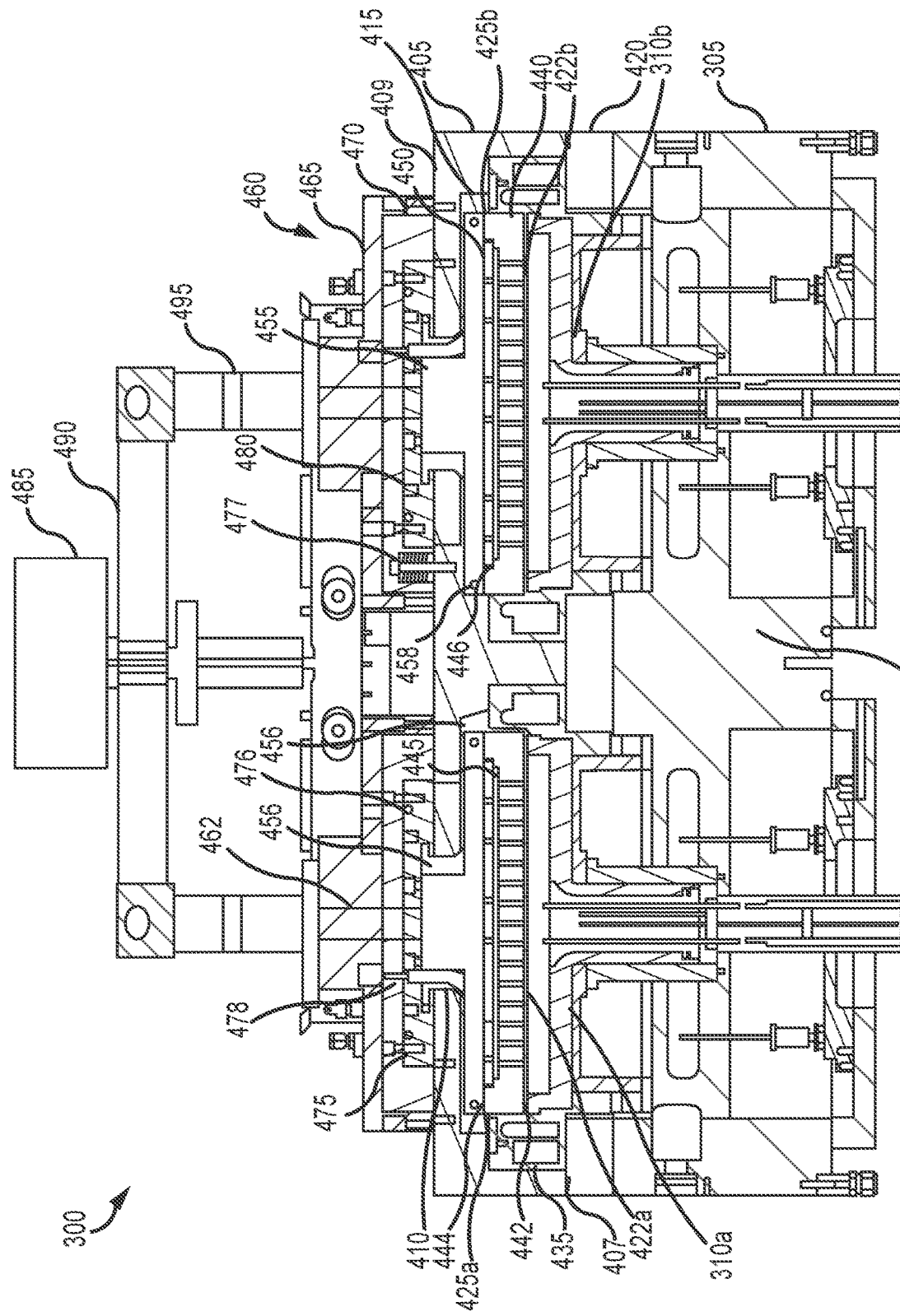
FIG. 4 shows a schematic partial cross-sectional view of an exemplary chamber system according to some embodiments of the present technology.

FIG. 4 shows a schematic cross-sectional elevation view of one embodiment of chamber system 300 according to some embodiments of the present technology. The figure may include components of any of the systems illustrated and described previously, and may also show further aspects of any of the previously described systems. It is to be understood that the illustration may also show exemplary components as would be seen through any two adjacent processing regions 108 in any quad section 109 described above. A lid plate 405 may be seated on chamber body 305. The lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. The lid plate 405 may also define apertures 410, which may provide separation of overlying regions of the transfer chamber to form processing regions for substrate processing.

Apertures 410 may be defined through first lid plate 405, and may be at least partially aligned with substrate supports in a transfer region 412. In some embodiments, a number of apertures 410 may equal a number of substrate supports in the transfer region 412, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

The lid plate 405 may also define a recess 415 in the first surface 407 of the lid plate 405 about each aperture 410 of the lid plate 405. Each recess 415 may extend partially through a thickness of the lid plate 405, with sidewalls of the lid plate 405 defining outermost edges of the recesses 415. Each recess 415 may have a constant width across a depth of the recess 415 in some embodiments, while in other embodiments the recess 415 may include areas of varying widths. For example, the recess 415 may have an upper section and a lower section. The lower section may have a larger diameter than the upper section such that a shoulder is formed above the lower section radially outward of the upper section.

The lid plate 405 may be seated directly on a top surface of the chamber body 305 in some embodiments. In other embodiments, an adaptor plate 420 may be positioned between the lid plate 405 and the chamber body 305. For example, the adaptor plate 420 may be seated on the top surface of the chamber body 305, with the first surface 407 of the lid plate 405 being seated atop the adaptor plate 420. The adaptor plate 420 may define a number of apertures, with the outer walls that define an outer boundary of each aperture at least partially defining a processing region 422. The adaptor plate 420 may define a further set of apertures that may be aligned with apertures 315 of the chamber body 305 to facilitate exhaust flow from the processing regions of the overlying structures.

Chamber system 300 may include a plurality of lid stacks 425, including a number of lid stacks equal to a number of apertures 410 of the plurality of apertures. For example, a lid stack 425 may be seated below each aperture 410 and at least partially within each recess 415. Each lid stack 425 may be seated on the adaptor plate 420 and/or the chamber body 305. For example, a bottommost component of each lid stack 425 may be seated on a top surface of the adaptor plate 420. In embodiments without an adaptor plate 425, the bottommost component of each lid stack 425 may be seated on a top surface of the chamber body 305. The lid stacks 425 may at least partially define processing regions 422 of the chamber system 300.

As illustrated, processing regions 422 may be vertically offset from the transfer region 412, but may be fluidly coupled with the transfer region. Additionally, each processing region may be separated from the other processing regions. Although the processing regions may be fluidly coupled with other processing regions through the transfer region from below, the processing regions may be fluidly isolated, from above, from each of the other processing regions. Each lid stack 425 may also be aligned with a substrate support in some embodiments. For example, as illustrated, lid stack 425a may be aligned over substrate support 310a, and lid stack 425b may be aligned over substrate support 310b. When raised to operational positions, such as a second position, the substrates may deliver substrates for individual processing within the separate processing regions. When in this position, as will be described further below, each processing region 422 may be at least partially defined from below by an associated substrate support in the second position.

The elevation view may illustrate the configuration or fluid coupling of one or more processing regions 422 with a transfer region 412. For example, a continuous transfer region 412 may be defined by chamber body 305. The housing may define an open interior volume in which a number of substrate supports 310 may be disposed. For example, as illustrated in FIG. 1, exemplary processing systems may include four or more, including a plurality of substrate supports 310 distributed within the chamber body 305 about the transfer region 412. The substrate supports may be pedestals as illustrated, although a number of other configurations may also be used. In some embodiments the pedestals may be vertically translatable between the transfer region 412 and the processing regions 422 overlying the transfer region. The substrate supports may be vertically translatable along a central axis of the substrate support along a path between a first position and a second position within the chamber system. Accordingly, in some embodiments each substrate support 310 may be axially aligned with an overlying processing region 422 defined by one or more chamber components.

The open transfer region may afford the ability of a transfer apparatus, which may be similar to transfer apparatus 220, to engage and move substrates, such as rotationally, between the various substrate supports. The transfer apparatus may be rotatable about a central axis. This may allow substrates to be positioned for processing within any of the processing regions 422 within the processing system. The transfer apparatus may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus 430 may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus and deliver the substrates into the processing regions 422, which may be vertically offset from the transfer region 412. For example, and as illustrated, substrate support 310a may deliver a substrate into processing region 422a, while substrate support 310b may deliver a substrate into processing region 422b. This may occur with the other two substrate supports and processing regions, as well as with additional substrate supports and processing regions in embodiments for which additional processing regions are included. In this configuration, the substrate supports may at least partially define a processing region 422 from below when operationally engaged for processing substrates, such as in the second position, and the processing regions may be axially aligned with an associated substrate support. The processing regions may be defined from above by the components of the lid stacks 425, which may each include one or more of the illustrated components. In some embodiments, each processing region may have individual lid stack components, although in some embodiments components may accommodate multiple processing regions 422. Based on this configuration, in some embodiments each processing region 422 may be fluidly coupled with the transfer region 412, while being fluidly isolated from above from each other processing region within the chamber system or quad section.

The lid stack 425 may include a number of components, which may facilitate flow of precursors through the chamber system, and may be at least partially contained between the lid plate 405 and the chamber body 305 (and adaptor plate 420 in embodiments that contain the adaptor plate 420). A pumping liner 435 may be seated on the chamber body 305 or the adaptor plate 420. Pumping liner 435 may be an annular component, and may at least partially define the processing region 422 radially, or laterally depending on the volume geometry. The pumping liner 435 may define an exhaust plenum within the liner, which may define a plurality of apertures on an inner annular surface of the pumping liner providing access to the exhaust plenum. The plurality of apertures of the exhaust plenum may be vertically aligned with the apertures 315 in the chamber body 305 (and, if present, apertures formed within the adaptor plate 420), which may facilitate delivering exhausted materials through an exhaust channel formed through the adaptor plate 420 and/or chamber body 305 as previously described. The pumping liner 435 may be at least partially received within the recess 415 of the lid plate 405. For example, the pumping liner 435 may be received in the lower portion of the recess 415, with the second surface 409 of the lid plate 405 being positioned radially outward of the pumping liner 435 and contacting a top surface of the adaptor plate 420 and/or the chamber body 305. The second surface 409 of the lid plate 405 may be radially outward of an inner surface of the adaptor plate 420 and/or the chamber body 305.

A faceplate 440 may be seated on the pumping liner 435, and may define a plurality of apertures through the faceplate 440 for delivering precursors into the processing region 422. Faceplate 440 may at least partially define an associated processing region 422 from above, which may at least partially cooperate with the pumping liner 435 and substrate support 310 in a raised position to generally define the processing region 422. Faceplate 440 may operate as an electrode of the system for producing a local plasma within the processing region 422, and thus in some embodiments, faceplate 422 may be coupled with an electrical source or may be grounded. In some embodiments the substrate support 310 may operate as the companion electrode for generating a capacitively-coupled plasma between the faceplate and the substrate support. The faceplate 440 may be characterized by a first surface 442 and a second surface 444 that is opposite the first surface 442. The first surface 442 may face the processing region 422. The second surface 444 may define a recess 445 that extends partially through a thickness of the faceplate 440. The recess 445 may have a first portion and a second portion, with the first portion being proximate the second surface 444 and having a larger diameter than the second portion, thereby forming a shelf 446 within the recess 445.

A diffuser plate 450 may be seated on or in the faceplate 440. For example, the diffuser plate 450 may be sized to fit within the first portion of the recess 445, with peripheral edges of the diffuser plate 450 being supported on the shelf 446. The diffuser plate 450 may define a number of apertures through the diffuser plate 450 that deliver process and clean gases to the faceplate 440. The diffuser plate 450 may help build back pressure on the back of the faceplate 440 and may help produce a more uniform flow distribution on and through the faceplate 440.

A heater 455 may be seated on the faceplate 440, with a lower surface of the heater 455 being in contact with the diffuser plate 450. The heater 455 may include at least one heating element 458, such as an AC heating coil that is connected to an AC power source. The heating element 458 may heat the diffuser plate 450, which then heats up the faceplate 440. The heater 455 may heat the diffuser plate 450 and faceplate 440 to various temperatures to meet the needs of a particular deposition operation. For example, the heater 455 may heat the diffuser plate 450 and faceplate 440 to temperatures greater than or about 250° C., greater than or about 275° C., greater than or about 300° C., greater than or about 325° C., greater than or about 350° C., greater than or about 375° C., greater than or about 400° C., or more. The heater 455 may include a first portion and a second portion, with the first portion having a smaller diameter than the second portion. For example, the second portion may be received within the upper section of the recess 415 of the lid plate 405, while the first portion of the heater 455 may be extend through the aperture 410 of the lid plate 405. A gap 456 may be formed between sides of the heater 455 and the lid plate 405, which may form a channel for purge gas to be flowed downward from a purge gas source alongside the heater 455 toward the faceplate 440. This purge gas may prevent any film deposition on various components of the lid stack 425 upstream of the faceplate 440. The heater 455 may define a central aperture 458 that extends through a thickness of the heater 455. The central aperture 458 may be centered and/or otherwise aligned with the diffuser plate 450 and faceplate 440, and may serve as a portion of a gas delivery channel that supplies precursors, plasma effluents, and/or purge gases to the faceplate 440 for delivery to the processing region 422.

A number of output manifolds 460 may be seated atop the lid plate 405. For example, an output manifold 460 may be positioned about each aperture 410, with a central aperture 462 of the output manifold 460 being in alignment with the central aperture 458 of the heater 455. The central aperture 462 may form an additional portion of the gas delivery channel for supplying precursors, plasma effluents, and/or purge gases to the faceplate 440 for delivery to the processing region 420. The output manifold 460 may define a number of other apertures and/or channels that may be used to deliver process and/or purge gases to the faceplate 440.

In some embodiments, the output manifold 460 may be a three-piece manifold. For example, a fixed manifold section 465 may be seated atop and coupled with the first surface 407 of the lid plate 405. The fixed manifold section 465 may extend radially beyond the aperture 410 of the lid plate 405. A lower surface of the fixed manifold section 465 may define a recess that receives a leveling plate 470. A lower surface of the leveling plate 470 may define a recess that receives an isolator plate 475. The leveling plate 470 may be seated against the first surface of the lid plate 405 radially outward of the aperture 410 of the lid plate 405. The isolator plate 475 may be coupled with a lower surface of the leveling plate 470 and may have a diameter that substantially matches a diameter of the aperture 410 of the lid plate 405 such that the isolator plate 475 is unsupported from below the isolator plate 475. The leveling plate 470 may include one or more leveling mechanisms 477, which may be used to level and/or align the leveling plate 470 and the isolator plate 475 relative to the lid plate 405 and/or components of the lid stack 425, such as pumping liner 435. For example, each leveling mechanism 477 may include a spring biased screw that, when tightened, draws a portion of each of the leveling plate 470 and the isolator plate 475 downward toward the lid plate 405 and that, when loosened, pushes a portion of each of the leveling plate 470 and the isolator plate 475 upward away from the lid plate 405. By providing a number of leveling mechanisms 477 arranged about the periphery of the aperture 410 of the lid plate 405, the leveling plate 470 and the isolator plate 475 may be precisely leveled.

The isolator plate 475 may define a cooling channel 476, which may allow a cooling fluid to be flowed about the isolator plate 475, and which may allow additional temperature control. As illustrated, the cooling channel 476 may be defined in a top surface of the isolator plate 475, and the leveling plate 470 may extend about the cooling channel 476 to form a hermetic seal. Cooling channel 476 may be annular in shape and may extend about central aperture 462. In some embodiments, cooling channel 476 may be concentric with the central aperture 462.

As described above, the output manifold 460 may define a number of apertures. These apertures may extend through each of the pieces of the three-piece manifold. For example, central aperture 462 may extend through each of the fixed manifold section 465, leveling plate 470, and isolator plate 475. Additional apertures may be formed through each of the pieces. For example, an aperture 478 may be defined that enables an AC power source for the heating element 458 to extend through the output manifold 460. Additionally, each piece of the output manifold 460 may define a purge aperture 480. A top end of the purge aperture 480 may be coupled with a purge gas source. A bottom end of the purge aperture 480 may be fluidly coupled with gap 456 to direct purge gas from the purge gas source downward to the faceplate 440. In some embodiments, the aperture 480 may include a narrow portion that serves as a choke for the purge gas, which may provide more even purge gas flow within the gap 456 about the sides of the heater 455. For example, a portion of the aperture 480 within the isolator plate 475 may define a narrow choke point within the insulator plate 475 that expands to a larger downstream section prior to reaching the gap 456.

A remote plasma unit 485 may optionally be included in chamber system 300 in some embodiments, and may be supported on the lid plate 405 and/or the output manifold 460. In some embodiments, remote plasma unit 485 may be fluidly coupled with the central aperture 462 of each output manifold 460. For example, a number of fluid lines 490 may extend from the remote plasma unit 485 and couple with the central aperture 462 of each output manifold 460 to fluidly couple the remote plasma unit 485 with the output manifold 460. The remote plasma unit 485 may provide precursors, plasma effluents, and/or purge gas for film deposition, chamber cleaning, and/or other processing operations. For example, the gases may be delivered through the fluid lines 490 and the central apertures of the output manifold 460 and heater 455 for delivery into the processing region 422 via the faceplate 440. Isolation valves 495 may be included along each fluid line to provide fluid control to each individual processing region 422.

O-rings or gaskets may be seated between each component of the lid stack 425, which may facilitate vacuum processing within chamber system 300 in some embodiments. The specific component coupling between the lid plate 405 and the chamber body 305 and/or adaptor plate 420 may occur in any number of ways, which may facilitate accessing system components. For example, a first set of couplings may be incorporated between the lid plate 405 and the chamber body 305 and/or adaptor plate 420, which may facilitate removal of both the lid plate 405 and each lid stack 425, which may provide access to the substrate supports or transfer apparatus within the transfer region of the chamber system. These couplings may include any number of physical and removable couplings extending between the two lid plates, which may allow them to be separated from the chamber body 305 and/or adaptor plate 420 as a whole. For example, a drive motor on a mainframe containing the chamber system 300 may be removably coupled with the lid plate 405, which may lift the components away from the chamber body 305.

When the couplings between the lid plate 405 and chamber body 305 and/or adaptor plate 420 are disengaged, lid plate 405 may be removed, which may facilitate access to one or more components of the lid stacks 425. The break within the lid stack 425 may occur between any two components described previously, some of which may be coupled with lid plate 405, and some of which may be coupled with chamber body 305 and/or adaptor plate 420. Although mechanical coupling may be included, the components may be decoupled and sit floating on the chamber body 305 and/or adaptor plate 420, such as with locating features maintaining proper alignment of the components. It is to be understood that the example is intended to be non-limiting, and illustrative of any number of break configurations between any two components of the lid stack 425 when the lid plate 405 is separated from the chamber body 305 and/or adaptor plate 420. Consequently, depending on the coupling between the lid plate and chamber body 305 and/or adaptor plate 420, the entire lid stack and lid plate may be removed providing access to the transfer region, or the lid plate may be removed providing access to the lid stack components.

The present technology includes substrate processing systems that may accommodate multiple substrate supports distributed in a chamber system providing multiple processing regions coupled with a transfer region. Additionally, some embodiments of the present technology incorporate a dual-lid configuration providing joint removal of the two lids or separate removal of a second lid plate, which may provide access to lid stack components of each processing region.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a chamber body defining a transfer region;
a lid plate seated on the chamber body along a first surface of the lid plate, wherein:
the lid plate defines a plurality of apertures through the lid plate; and
the lid plate further defines a recess about each aperture of the plurality of apertures in the first surface of the lid plate, each recess extending partially through a thickness of the lid plate; and
a plurality of lid stacks equal to a number of apertures of the plurality of apertures, wherein:
each recess receives at least a portion of one of the lid stacks of the plurality of lid stacks;
the plurality of lid stacks at least partially define a plurality of processing regions vertically offset from the transfer region;
each lid stack of the plurality of lid stacks comprises a pumping liner defining an exhaust plenum positioned atop the chamber body;
each lid stack further comprises a faceplate seated on the pumping liner and at least partially defining an associated processing region from above; and
the lid plate is disposed above each pumping liner and each faceplate.

2. The substrate processing system of claim 1, further comprising:
a plurality of substrate supports disposed about the transfer region, each substrate support of the plurality of substrate supports vertically translatable along a central axis of the substrate support between a first position and a second position.

3. The substrate processing system of claim 2, wherein:
each substrate support of the plurality of substrate supports is aligned with a lid stack of the plurality of lid stacks.

4. The substrate processing system of claim 1, wherein:
each processing region of the plurality of processing regions is fluidly coupled with the transfer region and fluidly isolated from above from each other processing region of the plurality of processing regions.

5. The substrate processing system of claim 1, wherein:
the transfer region comprises a transfer apparatus rotatable about a central axis and configured to engage substrates and transfer substrates among a plurality of substrate supports within the transfer region.

6. The substrate processing system of claim 1, wherein:
each lid stack further comprises a heater seated on the faceplate.

7. The substrate processing system of claim 1, further comprising:
each lid stack further comprises a diffuser plate seated within a central recess defined by the faceplate.

8. The substrate processing system of claim 1, further comprising:
an adaptor plate seated on the chamber body.

9. The substrate processing system of claim 1, further comprising:
an output manifold seated on the lid plate.

10. The substrate processing system of claim 9, further comprising:
a remote plasma unit fluidly coupled with an aperture defined by the manifold.

11. A substrate processing system comprising:
a chamber body defining a transfer region;
a plurality of substrate supports distributed about the transfer region within the chamber body;
a lid plate seated on the chamber body, wherein:
the lid plate defines a plurality of apertures through the lid plate equal to a number of substrate supports of the plurality of substrate supports;
the lid plate further defines a recess about each aperture of the plurality of apertures in a first surface of the lid plate, each recess extending partially through a thickness of the lid plate;
each aperture of the plurality of apertures is axially aligned with a substrate support of the plurality of substrate supports; and
each aperture of the plurality of apertures is characterized by a diameter greater than a diameter of an associated substrate support of the plurality of substrate supports; and
a plurality of lid stacks equal to a number of apertures of the plurality of apertures, each lid stack of the plurality of lid stacks being at least partially received within one of the recesses of the lid plate, wherein:

each lid stack of the plurality of lid stacks comprises a pumping liner defining an exhaust plenum positioned atop the chamber body;

each lid stack further comprises a faceplate seated on the pumping liner and at least partially defining an associated processing region from above; and the lid plate is disposed above each pumping liner and each faceplate.

12. The substrate processing system of claim 11, wherein: the plurality of lid stacks at least partially define a plurality of processing regions vertically offset from the transfer region.

13. The substrate processing system of claim 11, wherein: each faceplate defines a faceplate recess; and each lid stack further comprises a diffuser plate seated within the faceplate recess.

14. The substrate processing system of claim 11, wherein: each lid stack further comprises a heater seated on the faceplate.

15. The substrate processing system of claim 11, further comprising:

a transfer apparatus positioned within the transfer region and rotatable about a central axis, wherein the transfer apparatus is configured to engage substrates and transfer substrates among the plurality of substrate supports within the transfer region.

16. A substrate processing system comprising:

a chamber body defining a transfer region;

an adaptor plate seated on the chamber body;

a plurality of pumping liners seated atop the adaptor plate, each pumping liner defining an exhaust plenum;

a lid plate seated on the plurality of pumping liners along a first surface of the lid plate, wherein the lid plate defines a plurality of apertures through the lid plate; and a plurality of faceplates, each faceplate of the plurality of faceplates being positioned atop the adaptor plate and below the lid plate, wherein the plurality of faceplates at least partially define a plurality of processing regions vertically offset from the transfer region.

\* \* \* \* \*